US011342625B2

(12) United States Patent
D'Couto et al.

(10) Patent No.: US 11,342,625 B2
(45) Date of Patent: May 24, 2022

(54) METHOD OF FABRICATING AND METHOD OF USING POROUS WAFER BATTERY

(71) Applicant: Xnrgi, Inc., Bothell, WA (US)

(72) Inventors: Gerard Christopher D'Couto, Edmonds, WA (US); Slobodan Petrovic, Happy Valley, OR (US)

(73) Assignee: Xnrgi, Inc., Bothell, WA (US)

( * ) Notice: Subject to any disclaimer, the term of this patent is extended or adjusted under 35 U.S.C. 154(b) by 94 days.

(21) Appl. No.: 17/087,607

(22) Filed: Nov. 2, 2020

(65) Prior Publication Data
US 2021/0134608 A1    May 6, 2021

Related U.S. Application Data

(60) Provisional application No. 62/930,018, filed on Nov. 4, 2019, provisional application No. 62/930,019, filed
(Continued)

(51) Int. Cl.
*H01L 23/00*    (2006.01)
*H01M 10/04*    (2006.01)
(Continued)

(52) U.S. Cl.
CPC ...... *H01M 50/207* (2021.01); *H01L 21/4853* (2013.01); *H01L 21/76898* (2013.01); *H01L 22/14* (2013.01); *H01L 24/11* (2013.01); *H01L 24/14* (2013.01); *H01L 27/088* (2013.01); *H01L 29/66727* (2013.01); *H01L 29/7813* (2013.01); *H01M 4/13* (2013.01); *H01M 4/624* (2013.01); *H01M 4/628* (2013.01); *H01M 10/0477* (2013.01); *H01M 10/052* (2013.01); *H01M 10/0585* (2013.01); *H01M 10/42* (2013.01); *H01M 10/613* (2015.04); *H01M 10/615* (2015.04); *H01L 2021/60135* (2013.01); *H01M 2004/021* (2013.01)

(58) Field of Classification Search
CPC . H01L 23/58; H01L 23/49827; H01L 23/481; H01L 21/76898; H01L 21/486; H01L 29/7813; H01L 2225/06541; H01L 2225/06548; H01L 24/11–17; H01M 10/0436; H01M 10/0477; H01M 10/4257; H01M 50/207; H01M 4/134; H01M 2010/4271; H01M 2010/0495
See application file for complete search history.

(56) References Cited

U.S. PATENT DOCUMENTS 6,197,450 B1 * 3/2001 Nathan ............ H01G 9/155
429/304
8,600,543 B2    12/2013 Takechi et al.
(Continued)

*Primary Examiner* — Michael M Trinh
(74) *Attorney, Agent, or Firm* — Chen-Chi Lin

(57) ABSTRACT

A method of fabricating a porous wafer battery comprises the steps of providing a silicon wafer comprising a plurality of pores; applying a first metallization process; applying a passivation process; applying solder balls, aligning the silicon wafer with a substance, and applying a solder reflow process. A method using a porous wafer battery comprises the steps of connecting the porous wafer battery to a plurality of sensors, a plurality of switches, and a battery management system; monitoring temperature, resistance, or current; and electrically disconnecting a non-properly functioning pore.

15 Claims, 15 Drawing Sheets

Related U.S. Application Data on Nov. 4, 2019, provisional application No. 62/930,021, filed on Nov. 4, 2019, provisional application No. 62/930,016, filed on Nov. 4, 2019, provisional application No. 62/930,020, filed on Nov. 4, 2019.

(51) Int. Cl.

| | | |
|---|---|---|
| *H01M 10/42* | (2006.01) |
| *H01M 4/13* | (2010.01) |
| *H01L 21/768* | (2006.01) |
| *H01M 50/207* | (2021.01) |
| *H01M 10/613* | (2014.01) |
| *H01M 10/615* | (2014.01) |
| *H01L 21/48* | (2006.01) |
| *H01L 21/66* | (2006.01) |
| *H01L 27/088* | (2006.01) |
| *H01L 29/66* | (2006.01) |
| *H01L 29/78* | (2006.01) |
| *H01M 4/62* | (2006.01) |
| *H01M 10/052* | (2010.01) |
| *H01M 10/0585* | (2010.01) |
| *H01L 21/60* | (2006.01) |
| *H01M 4/02* | (2006.01) |

(56) References Cited

U.S. PATENT DOCUMENTS

| | | | |
|---|---|---|---|
| 9,768,441 B2* | 9/2017 | Zaghib | H01M 4/386 |
| 2003/0042587 A1 | 3/2003 | Lee | |
| 2006/0032046 A1* | 2/2006 | Nathan | C25D 9/04 |
| | | | 29/623.5 |
| 2006/0216857 A1* | 9/2006 | Zhao | H01L 24/94 |
| | | | 438/109 |
| 2013/0249109 A1* | 9/2013 | Ma | H01L 24/03 |
| | | | 257/774 |
| 2020/0020895 A1* | 1/2020 | Collins | H01M 4/044 |
| 2020/0212383 A1* | 7/2020 | Collins | H01M 10/0525 |
| 2020/0403268 A1* | 12/2020 | Hur | H01M 4/134 |
| 2021/0135003 A1* | 5/2021 | D'Couto | H01M 10/4257 |
| 2021/0135271 A1* | 5/2021 | D'Couto | H01M 4/628 |

* cited by examiner

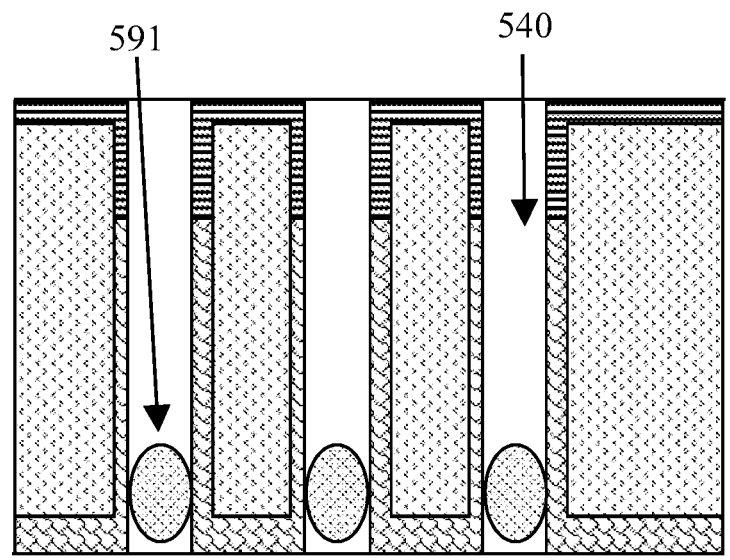
FIG. 5E1
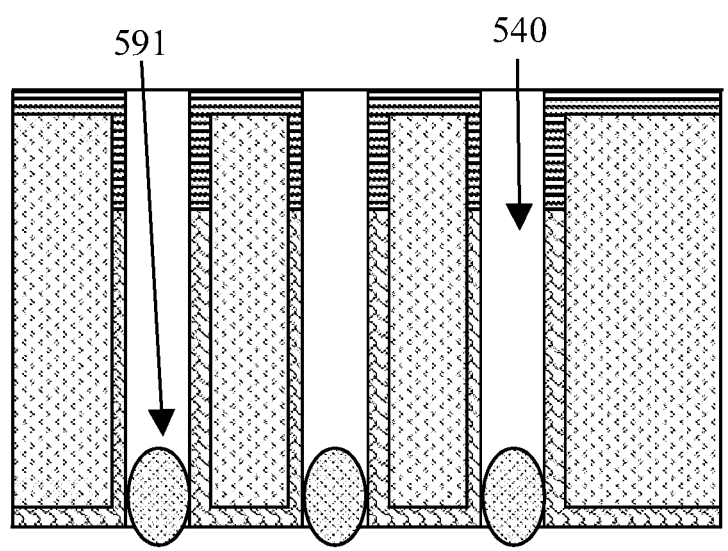
FIG. 5E2

METHOD OF FABRICATING AND METHOD OF USING POROUS WAFER BATTERY

CROSS-REFERENCE TO RELATED APPLICATIONS

This patent application claims benefit of provisional patent applications 62/930,016, 62/930,018, 62/930,019, 62/930,020, and 62/930,021 because of a common inventor, Slobodan Petrovic. The disclosures made in the provisional patent applications 62/930,016, 62/930,018, 62/930,019, 62/930,020, and 62/930,021 are hereby incorporated by reference. The disclosures made in U.S. Pat. No. 8,600,543 to Takechi et al. and US Patent Application Publication Number 2003/0042587 to Lee are also hereby incorporated by reference.

FIELD OF THE INVENTION

This invention relates generally to a method of fabricating a porous wafer battery. More particularly, the present invention relates to a porous wafer battery made by a semiconductor manufacturing process and a method using the porous wafer battery.

BACKGROUND OF THE INVENTION

Industry requires high-current, high-density batteries with excellent reliability performance and with long lasting power. Lithium batteries have inherent flaws and design limitations. It includes current, voltage and capacity limitations, and charge and discharge constraints. When a cell of a lithium battery is defective or damaged, it results in a potential dangerous condition that short circuit or even catching fire may occur.

Therefore, there is a need for a high-power density, high current and low cost battery stack facilitating efficiently scaling the size of the battery.

SUMMARY OF THE INVENTION

A fabrication method using partial steps similar to semiconductor flip-chip technology, to fabricate a porous battery, is disclosed. A battery management system may control the current during charging and to adjust the current based on the progress of the reaction of the porous battery.

A battery may be made by one or more wafers. Each wafer has one or more pores. Each pore may include an anode and cathode and form a single battery. Then, the single batteries are stacked. Each wafer may include many cells or batteries.

A plurality of wafers may be stacked in a housing. The housing can be a solid housing. The housing may include tabs, slots or grooves for holding the wafers in place. The housing may also include electrical connectors to transmit current to and from the wafers to an external device or destinations.

A method of fabricating a porous wafer battery is disclosed. The method comprises the steps of providing a silicon wafer comprising a plurality of pores; applying a first metallization process; applying a passivation process; applying solder balls, aligning the silicon wafer with a substance, and applying a solder reflow process.

A method using a porous wafer battery is disclosed. The method comprises the steps of connecting the porous wafer battery to a plurality of sensors, a plurality of switches, and a battery management system; monitoring temperature, resistance, or current; and electrically disconnecting a non-properly functioning pore.

BRIEF DESCRIPTION OF THE DRAWINGS

FIGS. 5A, 5B, 5C, 5D, 5E1, 5E2, 5F, and 5G show the steps of the process to fabricate a porous wafer battery in examples of the present disclosure.

DETAILED DESCRIPTION OF THE INVENTION

Figure 1:
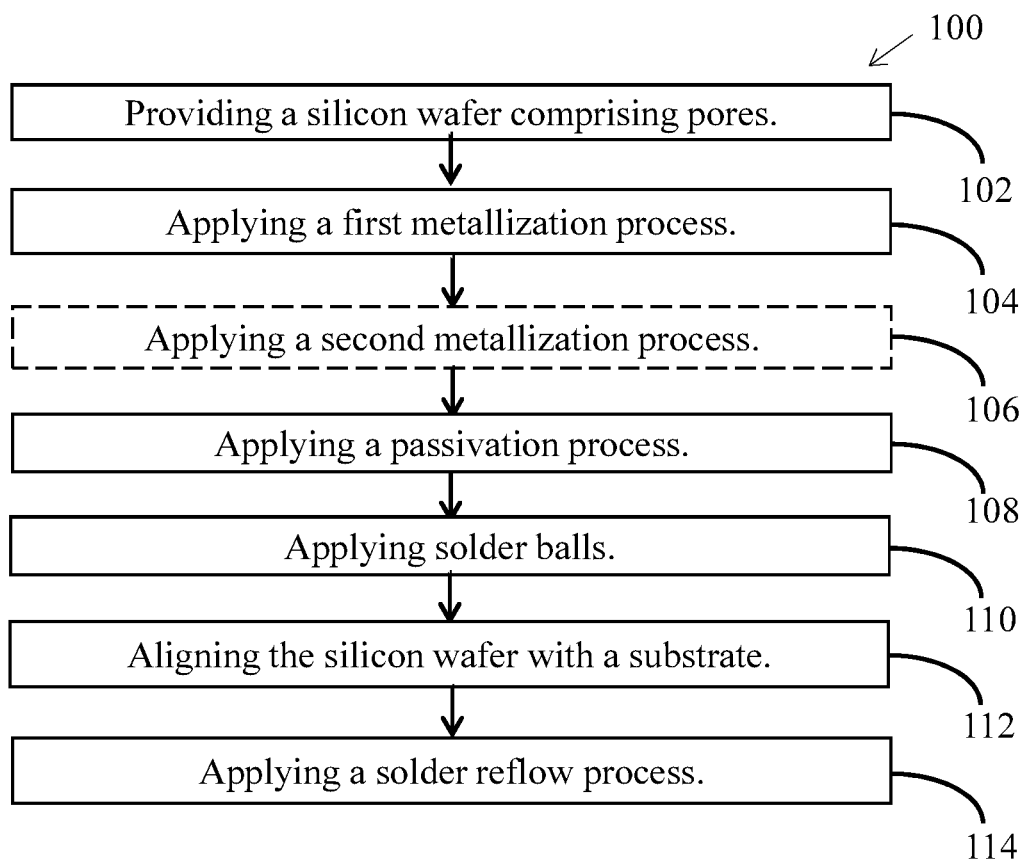
FIG. 1 is a flowchart of a process to develop a porous wafer battery in examples of the present disclosure.

FIG. 1 is a flowchart of a process 100 to develop a porous wafer battery in examples of the present disclosure. The process 100 may start from block 102. FIGS. 5A-5G show the cross sections, along BB' of FIG. 3, of the corresponding steps.

Figure 2:
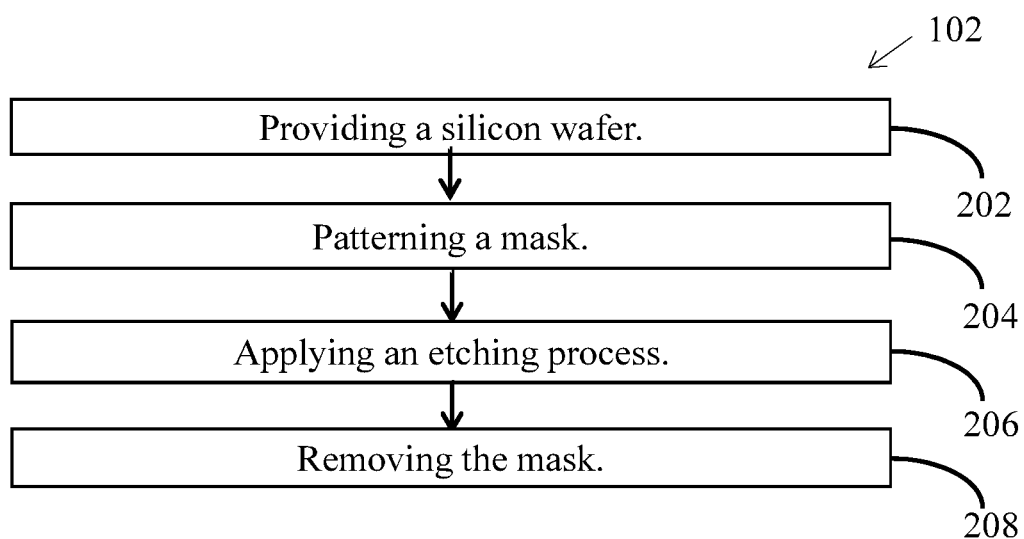
FIG. 2 is a flowchart of a sub-process to develop a silicon wafer including a plurality of pores in examples of the present disclosure.
Figure 3:
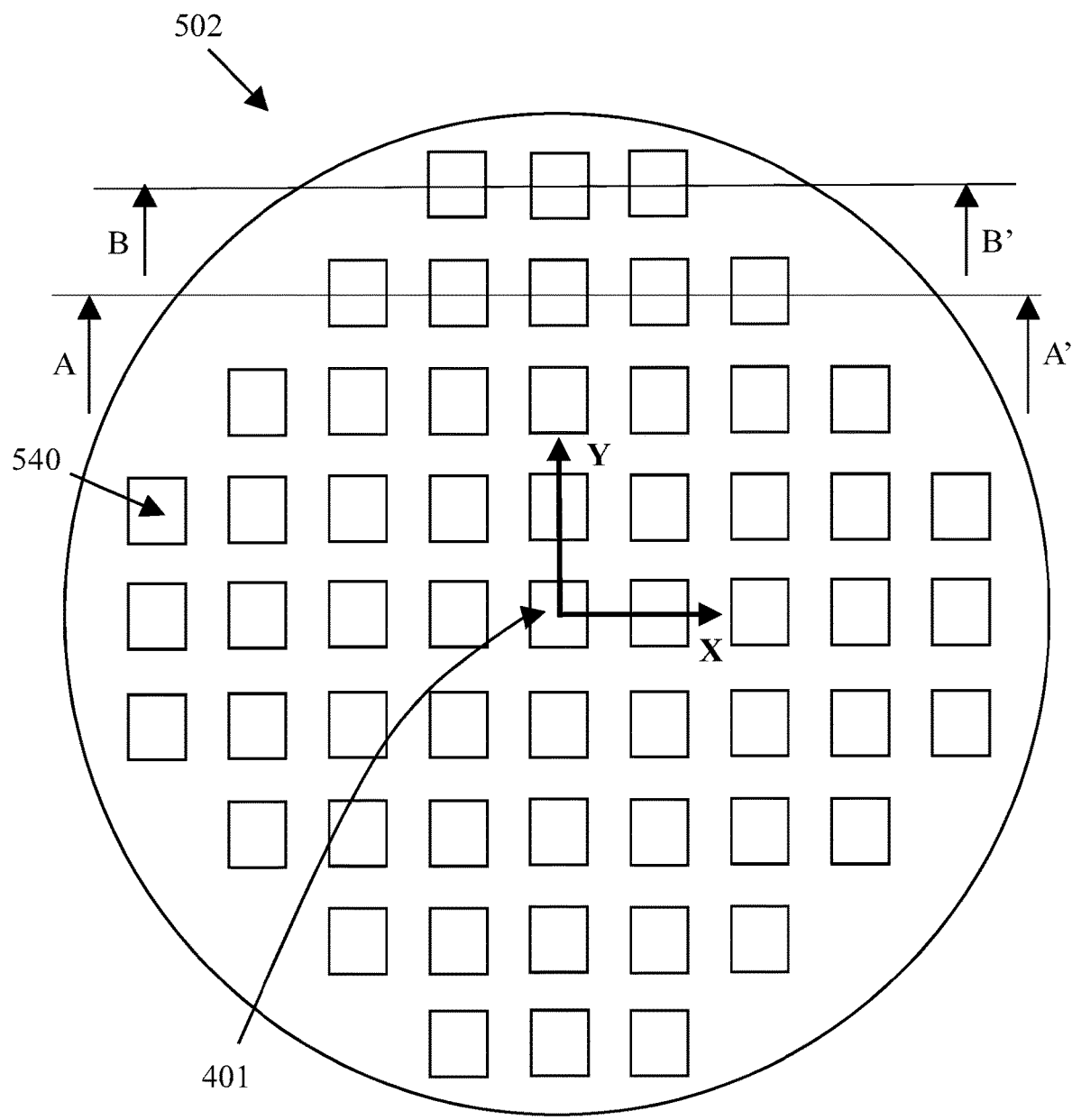
FIG. 3 is a front view of a porous wafer in examples of the present disclosure.
Figure 4A:
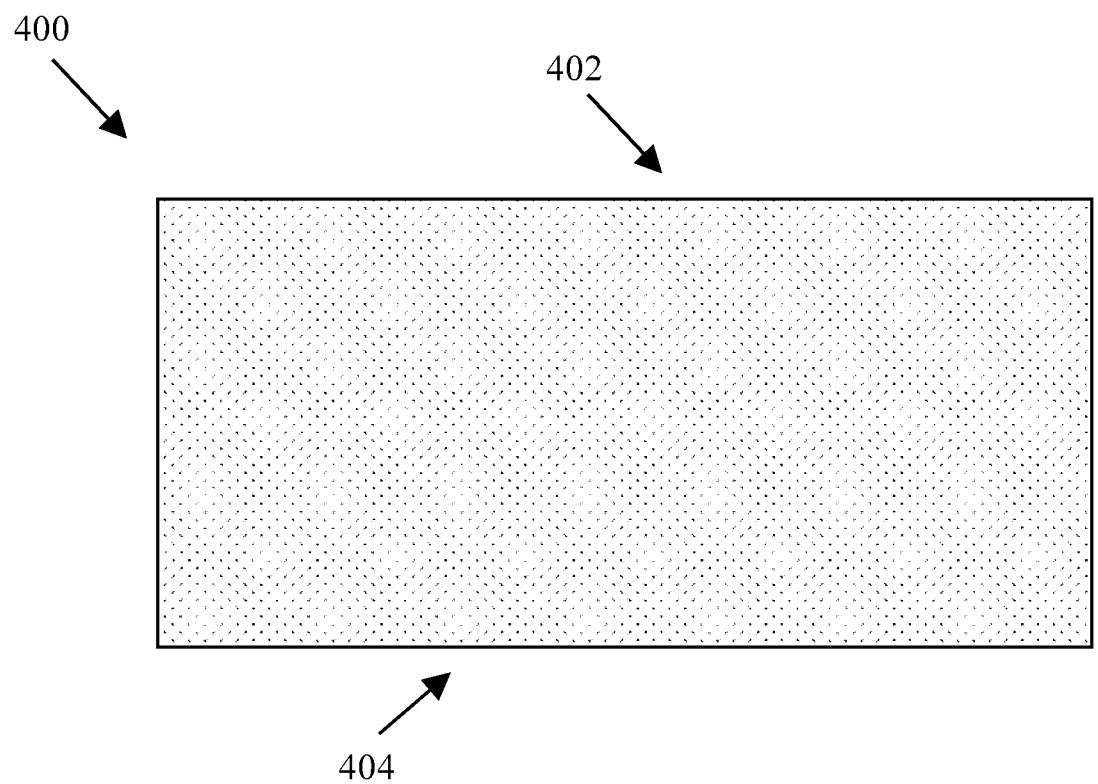
FIGS. 4A, 4B, 4C, and 4D show cross-sectional plots, along AA' of FIG. 3, of the steps of the sub-process to develop a silicon wafer including a plurality of pores in examples of the present disclosure.
Figure 4B:
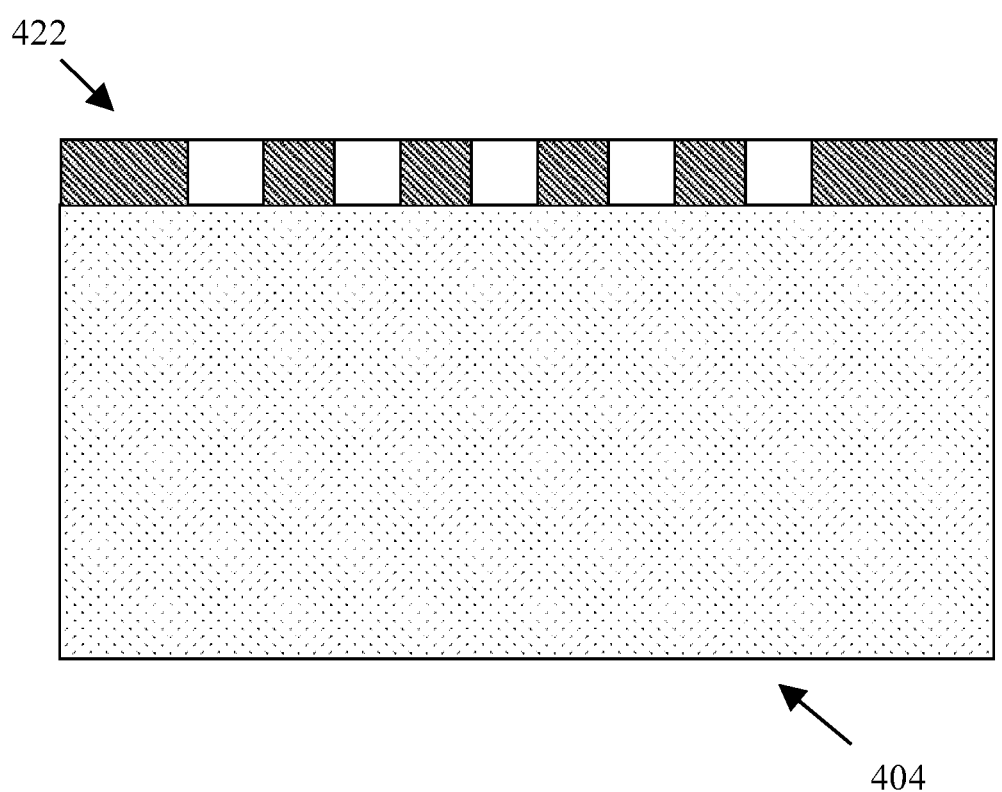
Figure 4C:
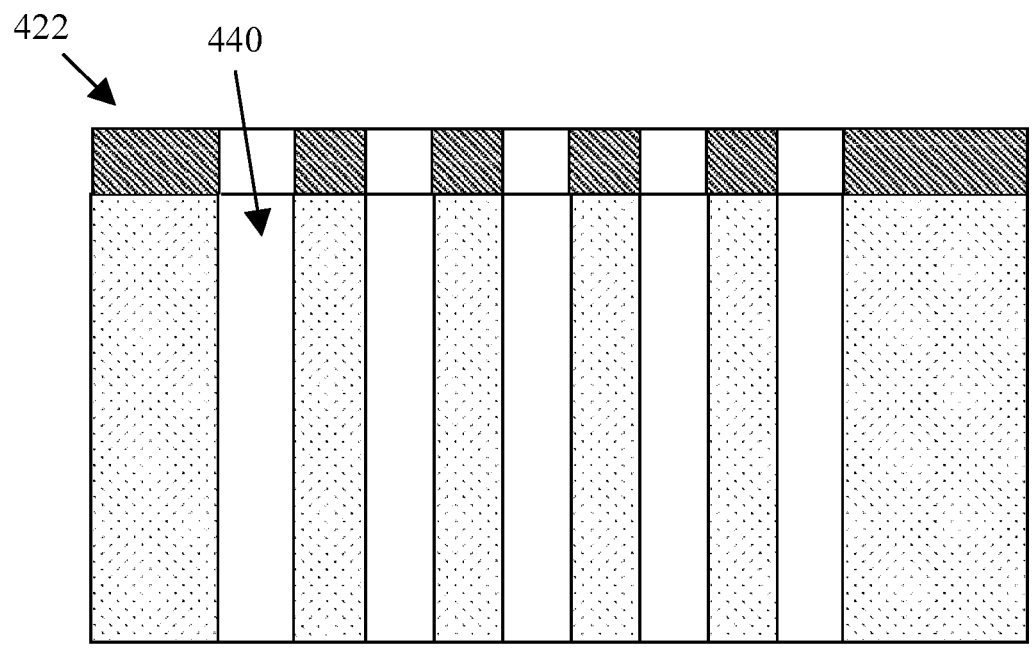
Figure 4D:
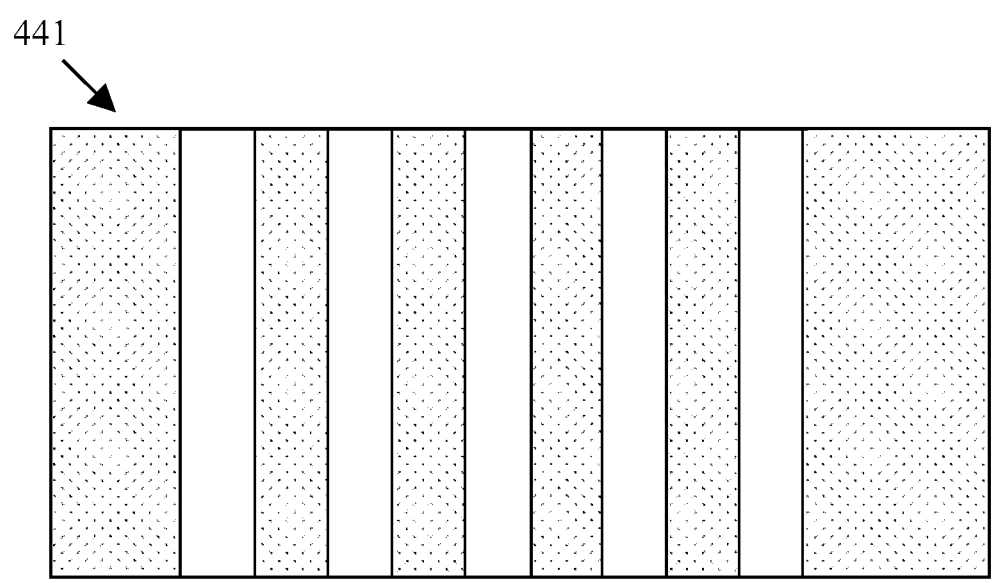
Figure 5A:
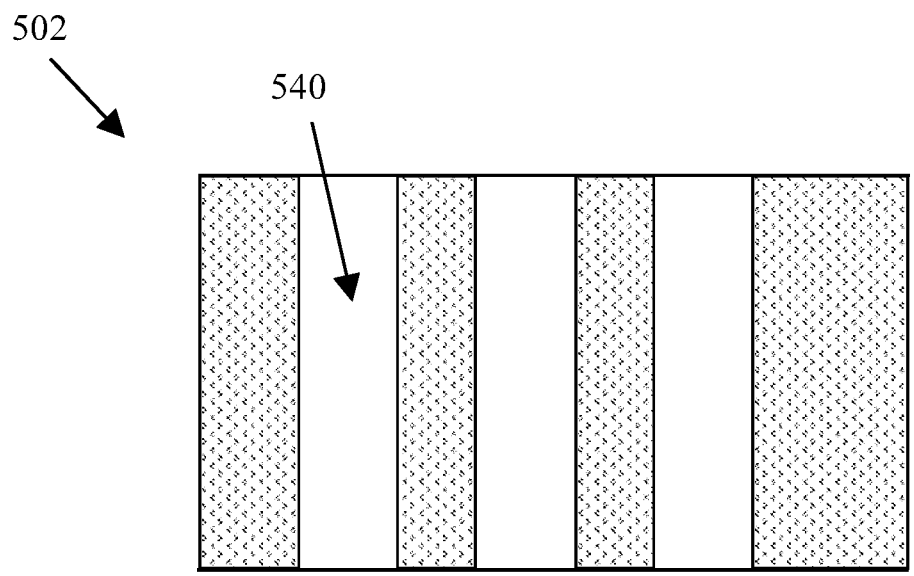

In block 102, referring now to FIG. 3 and FIG. 5A, a silicon wafer 502 comprising a plurality of pores 540 is provided. In examples of the present disclosure, the plurality of pores 540 are symmetric with respect to a center 401 of the silicon wafer 502. The plurality of pores 540 are symmetric with respect to X-axis. The plurality of pores 540 are symmetric with respect to Y-axis. In one example, the plurality of pores 540 are of rectangular shapes. In another example, the plurality of pores 540 are of square shapes. In still another example, the plurality of pores 540 are of circular shapes. In examples of the present disclosure, block 102 comprises a sub-process of FIG. 2 to develop the silicon wafer 502. The sub-process of FIG. 2 may start from block 202. FIGS. 4A-4D show the cross sections, along AA' of FIG. 3, of the corresponding sub-steps.

In block 202, referring now to FIG. 4A, a wafer 400 is provided. In examples of the present disclosure, the wafer 400 is a silicon wafer. The wafer 400 comprises a first side 402 (first surface) and a second side 404 (second surface). In one example, a diameter of the wafer 400 is 4 inches. In another example, a diameter of the wafer 400 is 6 inches. In still another example, a diameter of the wafer 400 is 8 inches. In yet another example, a diameter of the wafer 400 is 12 inches. In yet still another example, a diameter of the wafer 400 is 18 inches. Block 202 may be followed by block 204.

In block 204, referring now to FIG. 4B, a mask 422 is patterned on the first side 402 of the wafer 400. Horizontal sizes of a plurality of pores 440 of FIG. 4D are determined by the pattern of the mask 422. Block 204 may be followed by block 206.

In block 206, referring now to FIG. 4C, an etching process is performed. A plurality of pores 440 are formed. In one example, the etching process is a wet (anisotropic) etching using KOH, EDP (Ethylenediamine Pyrocatechol), CsOH, NaOH, or $N_2H_4$—$H_2O$ (Hydrazine). Wet etching may be followed by a laser damaging process. In another example, the etching process is a deep reactive-ion etching process. The plurality of pores 440 are through holes through the wafer 400. The through holes extend from the first side 402 of FIG. 4A of the silicon wafer to the second side 404 of FIG. 4A of the silicon wafer. Block 206 may be followed by block 208.

In block 208, referring now to FIG. 4D, the mask 422 of FIG. 4C is removed. Surfaces 441 are exposed. Therefore, a silicon wafer comprising a plurality of pores is formed. Block 208 may be followed by block 104 of FIG. 1.

Figure 5B:
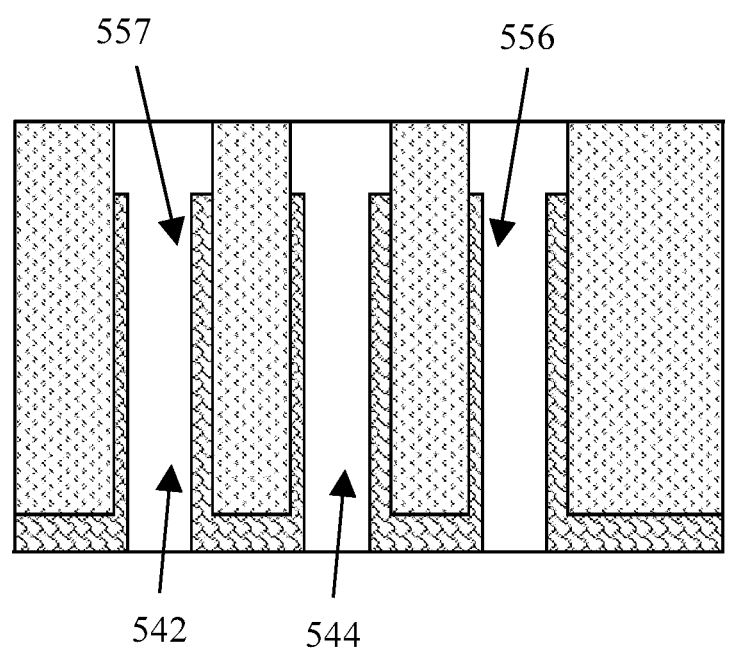

In block 104, referring now to FIG. 5B, a first metallization process is applied. A first respective metal section 557 of a first plurality of metal sections 556 covers a portion of side walls of a first selected pore 542 and a portion of side walls of a second selected pore 544. The second selected pore 544 is an adjacent pore of the first selected pore 542. In examples of the present disclosure, a thickness of the first plurality of metal sections 556 is in a range from 20 microns to 200 microns. In examples of the present disclosure, the first respective metal section 557 is of a letter U shape. In one example, the first respective metal section 557 is made of copper. In another example, the first respective metal section 557 is made of nickel, titanium, titanium nitride, silicates, or silicon carbide. Block 114 may be followed by block 106 or block 108.

Figure 5C:
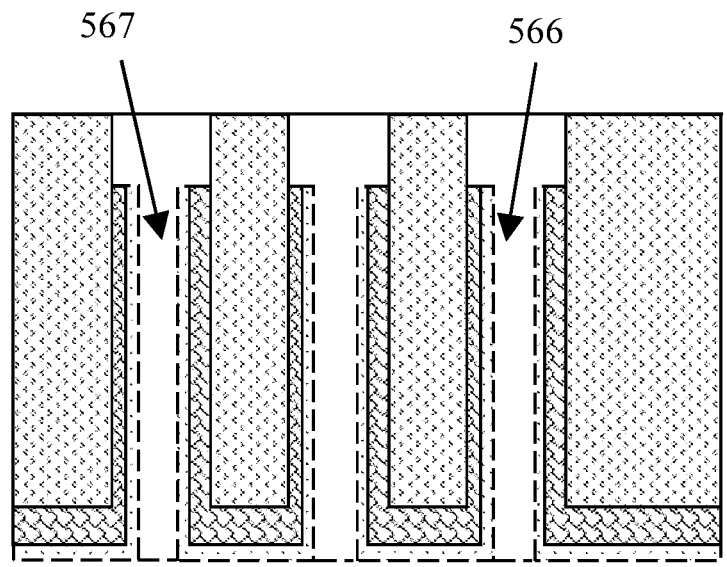

In optional block 106 (shown in dashed lines), referring now to FIG. 5C, a second metallization process is applied. A second respective metal section 567 of a second plurality of metal sections 566 (shown in dashed lines because of being optional) covers the first respective metal section 557. In examples of the present disclosure, a thickness of the second plurality of metal sections 566 is in a range from 20 microns to 200 microns. In examples of the present disclosure, the second respective metal section 567 is of a letter U shape. In one example, the second respective metal section 567 is made of copper. In another example, the second respective metal section 567 is made of titanium nitride, silicates, silicon carbide. Block 106 may be followed by block 108.

Figure 5D:
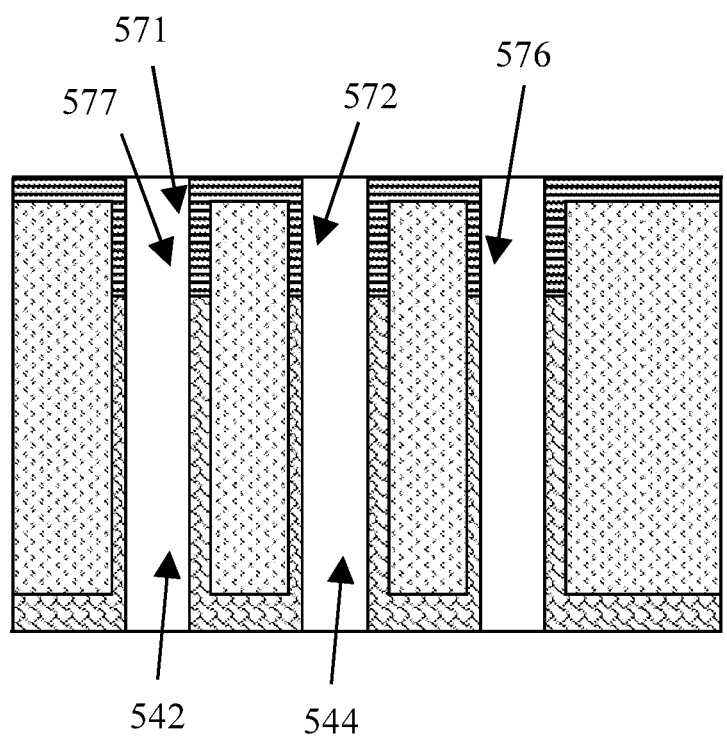

In block 108, referring now to FIG. 5D, a passivation process is applied. A plurality of passivation sections 576 are formed. Advantages of the plurality of passivation sections 576 are to prevent lithium reduction and to reduce dendrite growth. In examples of the present disclosure, a thickness of the plurality of passivation sections 576 is in a range from 20 microns to 200 microns. In examples of the present disclosure, each passivation section 577 of the plurality of passivation sections 576 is of a letter U shape. Letter U shape passivation section provides better insulation than flat passivation section. A first leg 571 of the letter U shape is directly attached to the second respective metal section of a first selected pore 542 of the plurality of pores. A second leg 572 of the letter U shape is directly attached to the second respective metal section of a second selected pore 544 of the plurality of pores. The first selected pore 542 is different from the second selected pore 544. Block 108 may be followed by block 110.

In block 110, referring now to FIG. 5E1 and FIG. 5E2, a plurality of solder balls 591 are applied. In examples of the present disclosure, a diameter of each solder ball of the plurality of solder balls 591 is less than 50 microns. A respective solder ball of the plurality of solder balls 591 is disposed at each pore of the plurality of pores 540. In FIG. 5E1, an entirety of a respective solder ball of the plurality of solder balls 591 is in each pore of the plurality of pores 540. In FIG. 5E2, a majority portion (>50%) of the respective solder ball of the plurality of solder balls 591 is in each pore of the plurality of pores 540. A minority portion (<50%) of the respective solder ball of the plurality of solder balls 591 is out of each pore of the plurality of pores 540. Block 110 may be followed by optional block 112.

Figure 5F:
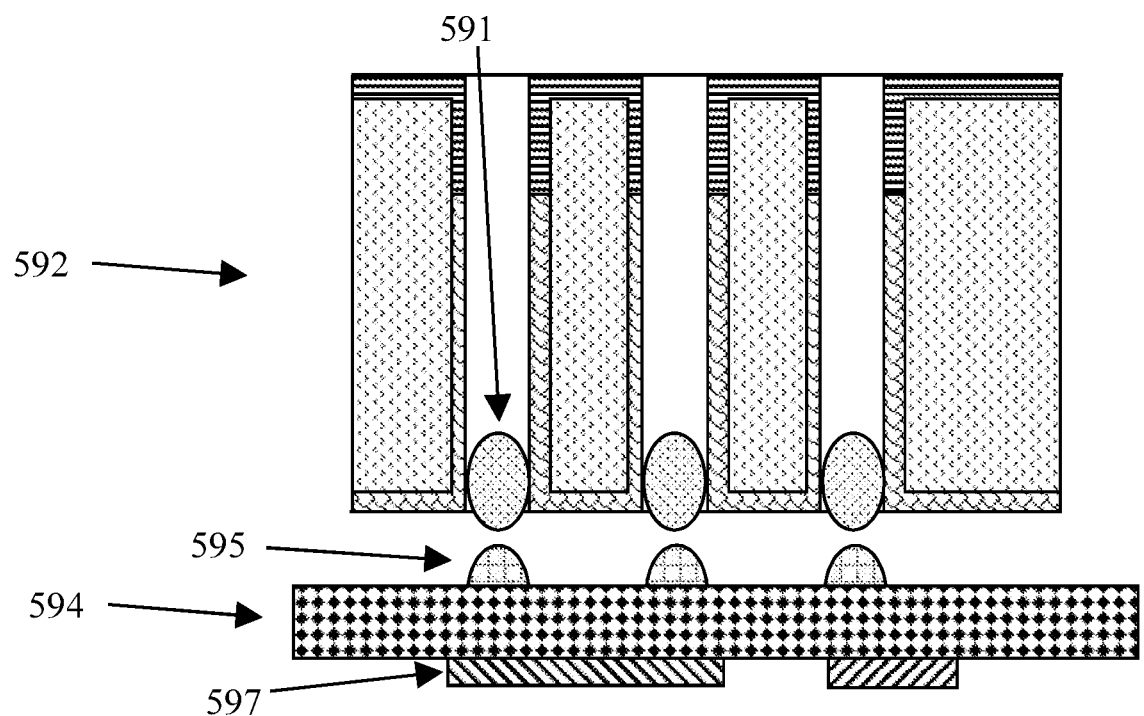

In block 112, referring now to FIG. 5F, the processed silicon wafer 592 is aligned with a substrate 594. The substrate 594 comprises a plurality of contact bumps 595 and a plurality of conductive members 597. The plurality of contact bumps 595 are aligned with the plurality of solder balls 591. Block 112 may be followed by block 114.

Figure 5G:
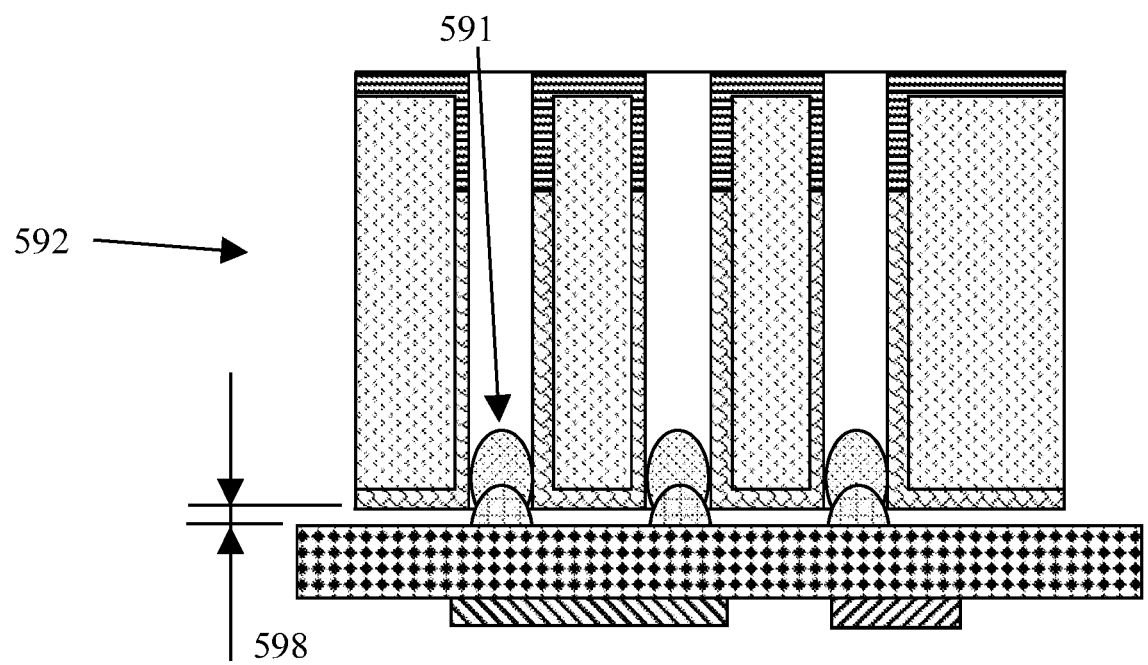

In block 114, referring now to FIG. 5G, a solder reflow process is applied. In one example, a flip chip technology, similar to FIG. 6 of US Patent Application Publication Number 2003/0042587 to Lee, is applied. A respective contact bump of the plurality of contact bumps 595 is attached to each solder ball of the plurality of solder balls 591. In one example, a distance 598 is zero so that a bottom surface of the processed silicon wafer 592 directly contacts a top surface of the substrate 594. In another example, the distance 598 is less than 50 microns. The inductance of a connection of a respective contact bump of the plurality of contact bumps 595 and each solder ball of the plurality of solder balls 591 is less than 0.05 nH. It is much smaller than 1 nH for a connection by a conventional 125-mm long and 25-mm diameter wire.

Figure 6:
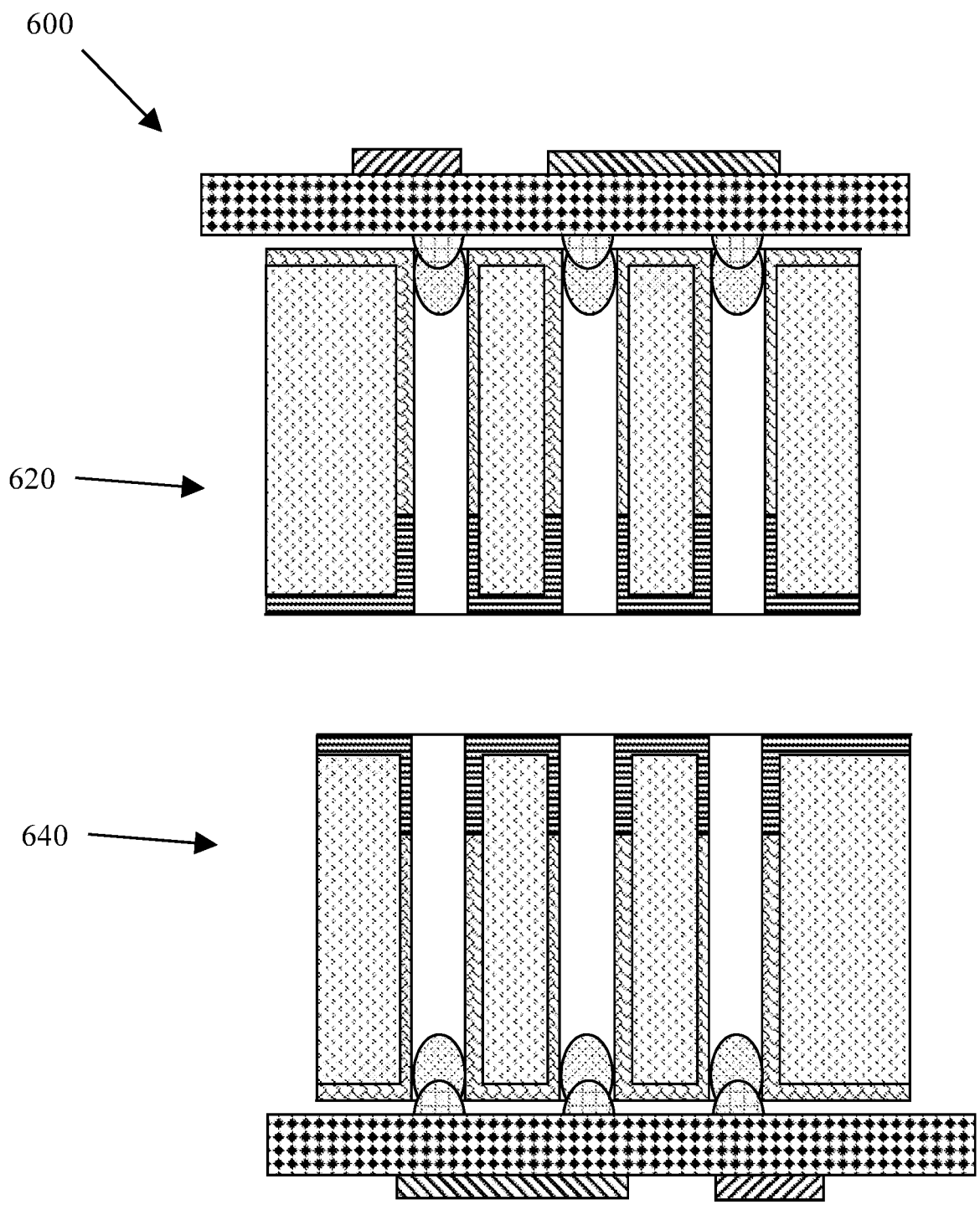
FIG. 6 shows two silicon wafers forming a porous wafer battery in examples of the present disclosure.

FIG. 6 shows a porous wafer battery 600 in examples of the present disclosure. The porous wafer battery 600 comprises a first processed silicon wafer 620 made by the process of FIG. 1 and a second processed silicon wafer 640 made by the process of FIG. 1. In examples of the present disclosure, the first processed silicon wafer 620 is served as an anode. The second processed silicon wafer 640 is served as an anode.

Figure 7:
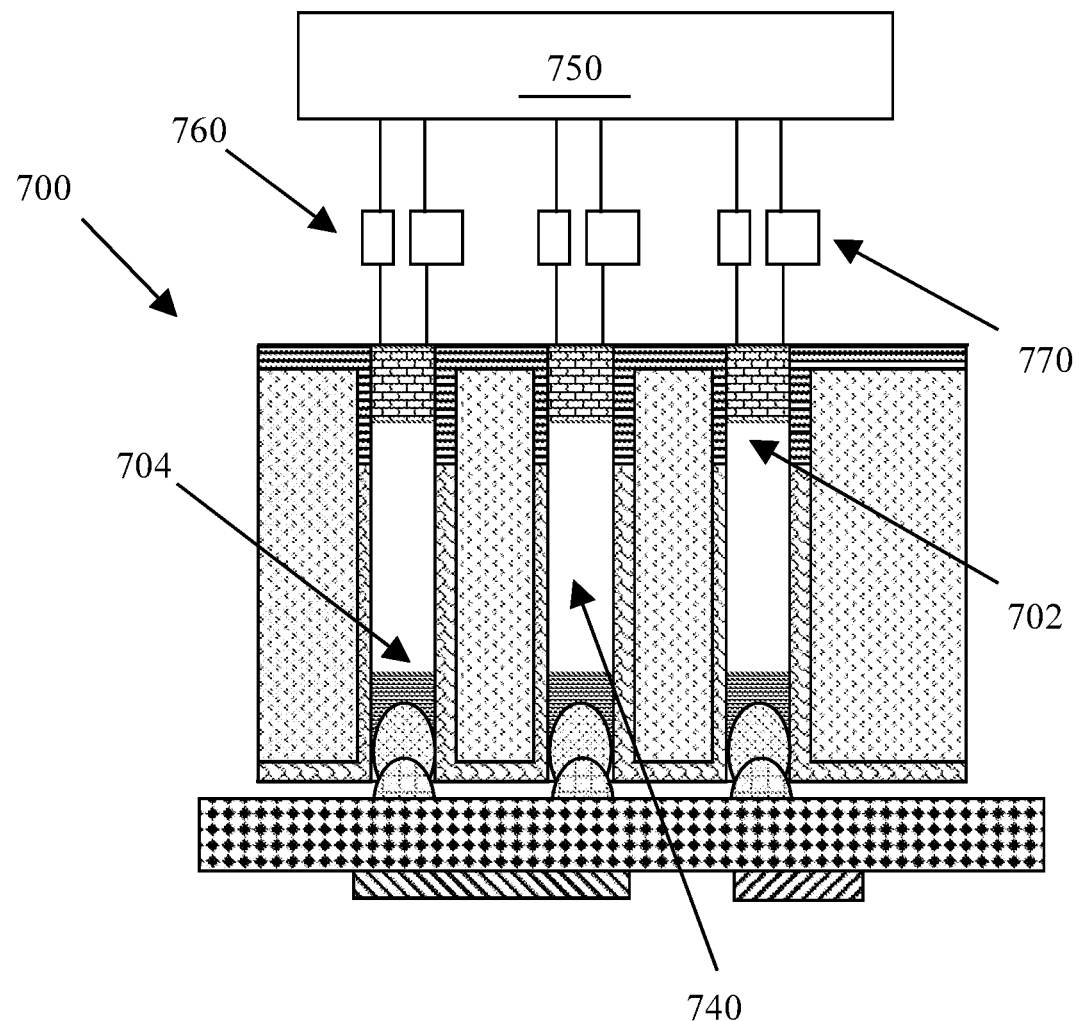
FIG. 7 shows a single silicon wafer forming a porous wafer battery in examples of the present disclosure.

FIG. 7 shows a processed silicon wafer 700 in examples of the present disclosure. A respective anode of a plurality of anodes 702 is in each pore of the plurality of pores 740. A respective cathode of a plurality of cathodes 704 is in each pore of the plurality of pores 740. Each pore of the plurality of pores 740 is connected to a respective sensor of a plurality of sensors 760. In one example, the sensor is a temperature sensor (in one example, thermal electric element 32 of FIG. 4C of U.S. Pat. No. 8,600,543 to Takechi et al.). In another example, the sensor is a sensor to measure resistance. In still another example, the sensor is a current sensor. Each pore of the plurality of pores 740 is connected to a respective switch of a plurality of switches 770. The plurality of sensors 760 and the plurality of switches 770 are connected to a battery management system 750. The battery management system 750 receives measured data from the plurality of sensors 760. The battery management system 750 sends signals to turn on and off the plurality of switches 770.

Figure 8:
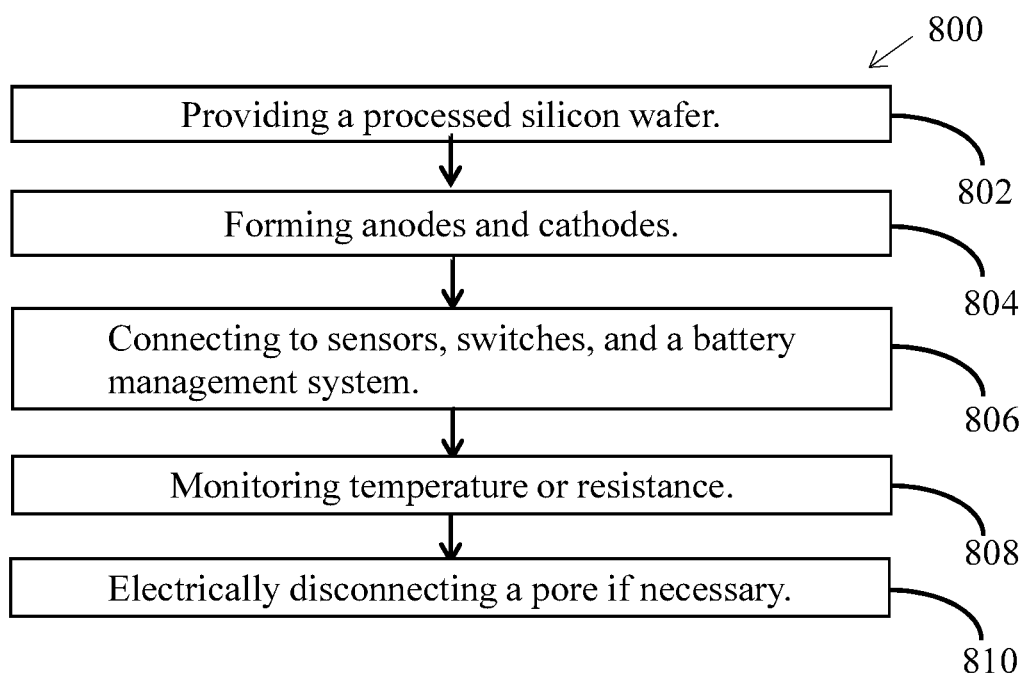
FIG. 8 shows a flowchart of a process to use a porous wafer battery in examples of the present disclosure.

FIG. 8 shows a flowchart of a process 800 to use a porous wafer battery in examples of the present disclosure. The process 800 may start from block 802.

In block 802, referring now to FIG. 7, a processed silicon wafer 700 is provided. Block 802 may be followed by block 804.

In block 804, still referring to FIG. 7, a respective anode of a plurality of anodes 702 is formed in each pore of the plurality of pores 740. A respective cathode of a plurality of cathodes 704 is formed in each pore of the plurality of pores 740. Block 804 may be followed by block 806.

In block 806, still referring to FIG. 7, the battery management system 750, the plurality of sensors 760, the plurality of switches 770, and the processed silicon wafer 700 are electrically connected. Block 806 may be followed by block 808.

In block 808, still referring to FIG. 7, temperature or resistance of each of the plurality of pores 740 is monitored. Block 808 may be followed by block 810.

In block 810, still referring to FIG. 7, electrically disconnect a selected pore by turning off a respective switch if the respective temperature of the selected pore is larger than a first predetermined value or if the respective resistance of the selected pore is smaller than a second predetermined value. In one example, the first predetermined value is 65 degrees C. In another example, the first predetermined value is 100 degrees C. In still another example, the first predetermined value is 130 degrees C. In one example, the second predetermined value is 1 ohm. In another example, the second predetermined value is 10 ohm. In still another example, the second predetermined value is 100 ohm.

Figure 9:
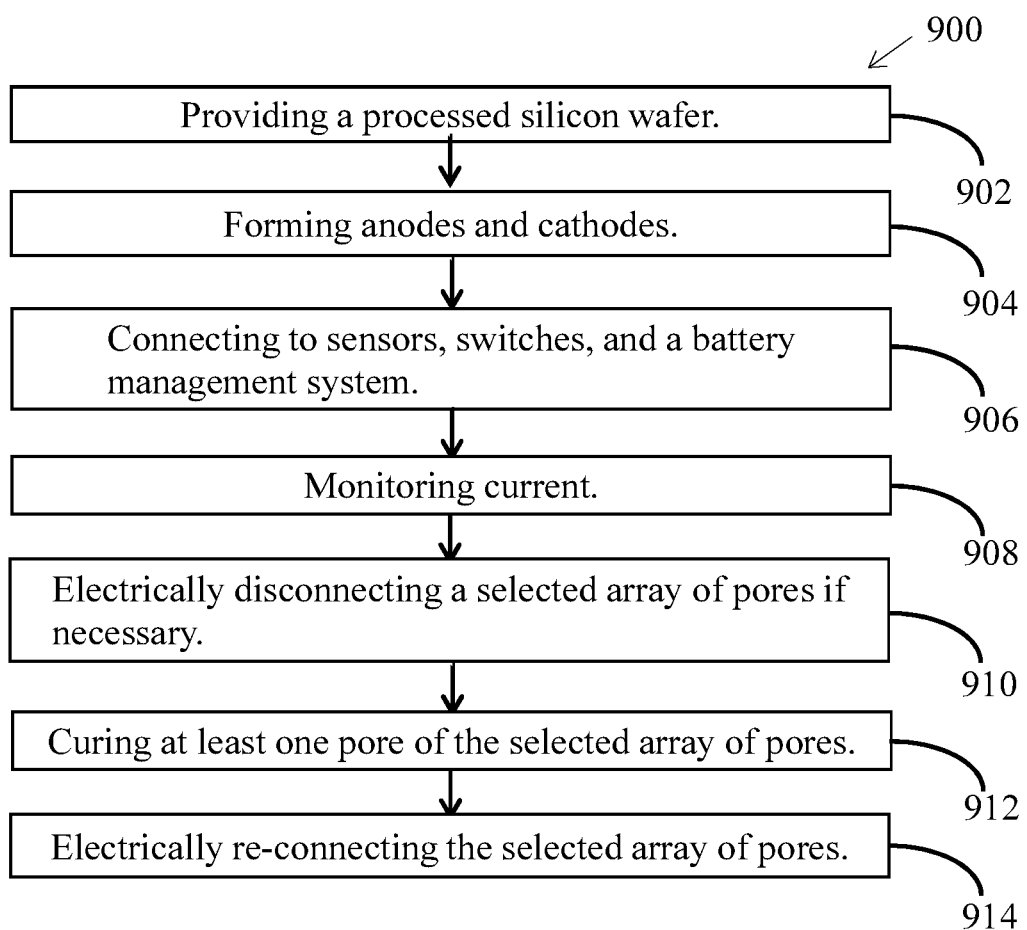
FIG. 9 shows a flowchart of another process to use a porous wafer battery in examples of the present disclosure.

FIG. 9 shows a flowchart of a process 900 to use a porous wafer battery in examples of the present disclosure. The process 900 may start from block 902.

In block 902, referring now to FIG. 7, a processed silicon wafer 700 is provided. Block 902 may be followed by block 904.

In block 904, still referring to FIG. 7, a respective anode of a plurality of anodes 702 is formed in each pore of the plurality of pores 740. A respective cathode of a plurality of cathodes 704 is formed in each pore of the plurality of pores 740. Block 904 may be followed by block 906.

In block 906, still referring to FIG. 7, the battery management system 750, the plurality of sensors 760, the plurality of switches 770, and the processed silicon wafer 700 are electrically connected. Block 906 may be followed by block 908.

In block 908, still referring to FIG. 7, current of each of the plurality of pores 740 is monitored. Block 908 may be followed by block 910.

In block 910, still referring to FIG. 7, electrically disconnect a selected array of pores by turning off respective switches if the respective current of at least one pore of the selected array of pores is smaller than a predetermined value. In one example, the predetermined value is 10 A. In another example, the predetermined value is 100 A. In still another example, the predetermined value is 1,000 A. Block 910 may be followed by block 912.

In block 912, still referring to FIG. 7, cure the at least one pore of the selected array of pores causing low current. Block 912 may be followed by block 914.

In block 914, still referring to FIG. 7, after the at least one pore of the selected array of pores is cured, electrically reconnect the selected array of pores by turning on the respective switches.

Figure 10:
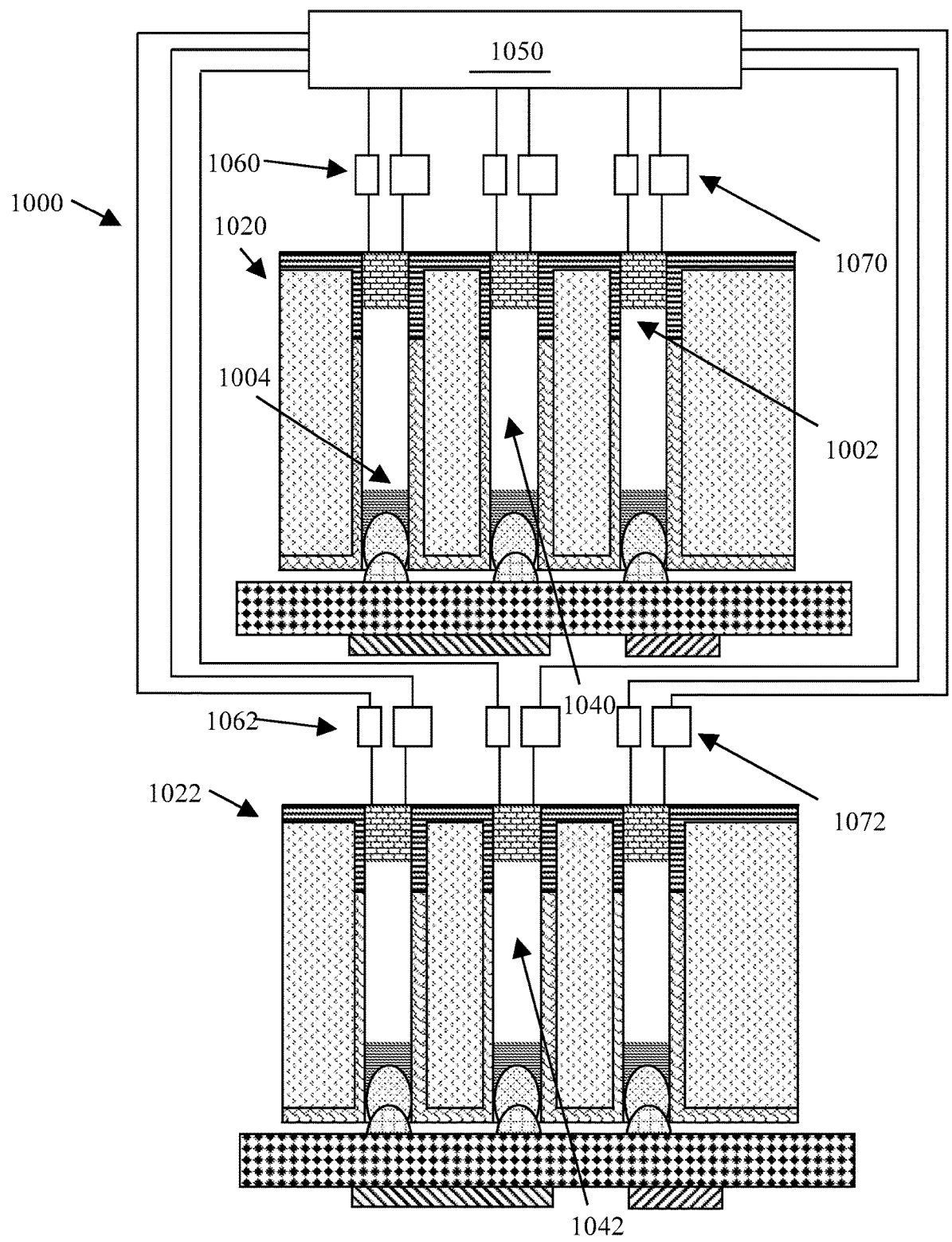
FIG. 10 shows a stacked porous wafer battery in examples of the present disclosure.

FIG. 10 shows a stacked processed silicon wafers 1000 in examples of the present disclosure. The stacked processed silicon wafers 1000 comprise two or more processes silicon wafers made by the process of FIG. 1. Although only two processed silicon wafers 1020 and 1022 are shown in FIG. 10, a number of the processed silicon wafers may vary. A respective anode of a plurality of anodes 1002 is in each pore of the plurality of pores 1040. A respective cathode of a plurality of cathodes 1004 is in each pore of the plurality of pores 1040. Each pore of the plurality of pores 1040 is connected to a respective sensor of a plurality of sensors 1060. Each pore of the plurality of pores 1042 is connected to a respective sensor of a plurality of sensors 1062. In one example, the sensor is a temperature sensor (in one example, thermal electric element 32 of FIG. 4C of U.S. Pat. No. 8,600,543 to Takechi et al.). In another example, the sensor is a sensor to measure resistance. In still another example, the sensor is a current sensor. Each pore of the plurality of pores 1040 is connected to a respective switch of a plurality of switches 1070. Each pore of the plurality of pores 1042 is connected to a respective switch of a plurality of switches 1072. The plurality of sensors 1060, the plurality of sensors 1062, the plurality of switches 1070 and the plurality of switches 1072 are connected to a battery management system 1050. The battery management system 1050 receives measured data from the plurality of sensors 1060 and the plurality of sensors 1062. The battery management system 1050 sends signals to turn on and off the plurality of switches 1070 and the plurality of switches 1072.

Figure 11:
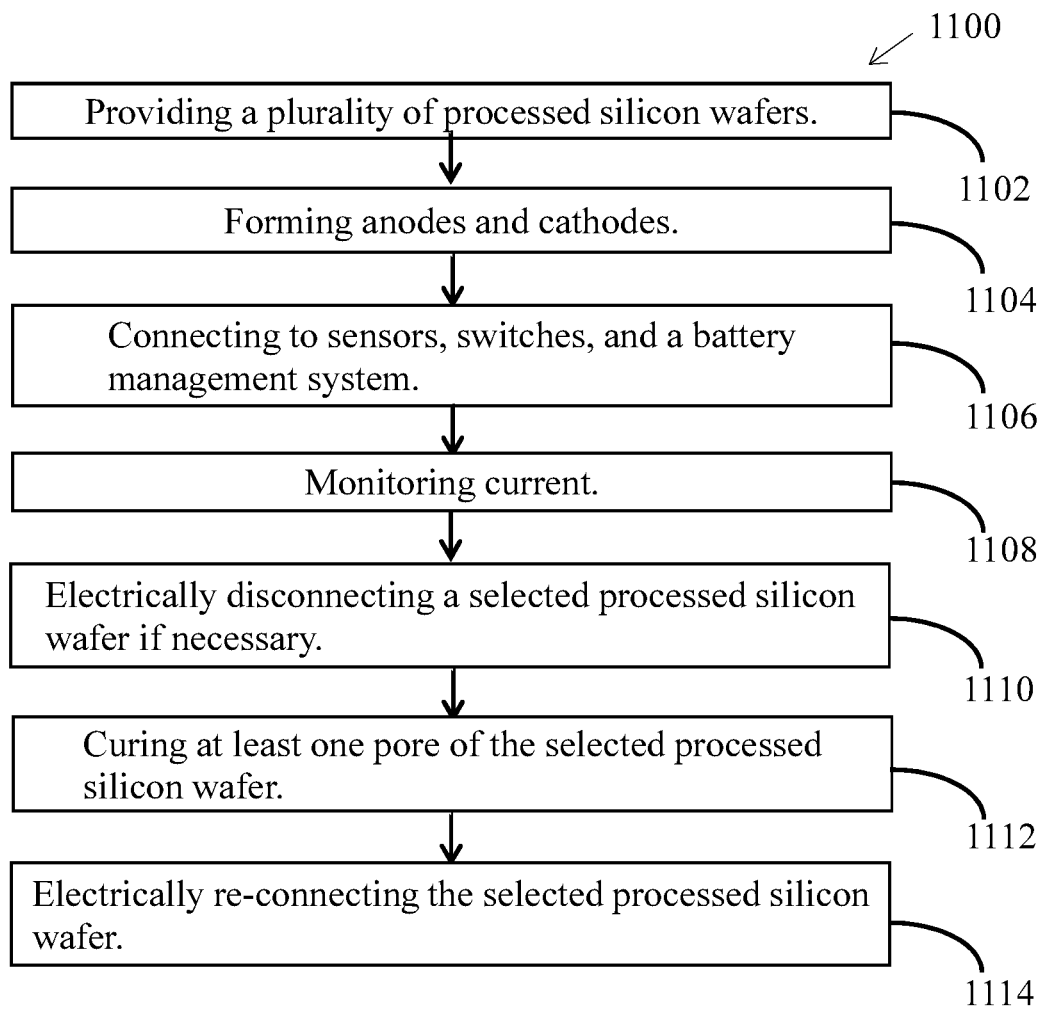
FIG. 11 shows a flowchart of a process to use a stacked porous wafer battery in examples of the present disclosure.

FIG. 11 shows a flowchart of a process 1100 to use a stacked processed silicon wafers 1000 of FIG. 10 in examples of the present disclosure. The process 1100 may start from block 1102.

In block 1102, referring now to FIG. 10, a stacked processed silicon wafers 1000 are provided. The stacked processed silicon wafers 1000 comprise at least a first processed silicon wafers 1020 and a second processed silicon wafer 1022. Block 1102 may be followed by block 1104.

In block 1104, still referring to FIG. 10, a respective anode of a plurality of anodes 1002 is formed in each pore of the plurality of pores 1040. A respective cathode of a plurality of cathodes 1004 is formed in each pore of the plurality of pores 1040. Block 1104 may be followed by block 1106.

In block 1106, still referring to FIG. 10, the battery management system 1050, the first plurality of sensors 1060, the second plurality of sensors 1062, the first plurality of switches 1070, the second plurality of switches 1072, the first processed silicon wafer 1020, and the second processed silicon wafer 1022 are electrically connected. Block 1106 may be followed by block 1108.

In block 1108, still referring to FIG. 10, current of each of the plurality of pores 1040 and the plurality of pores 1042 is monitored. Block 1108 may be followed by block 1110.

In block 1110, still referring to FIG. 10, electrically disconnect a selected processed silicon wafer by turning off respective switches if the respective current of at least one pore of the selected processed silicon wafer is smaller than a predetermined value. In one example, the predetermined value is 10 A. In another example, the predetermined value is 100 A. In still another example, the predetermined value is 1,000 A. Block 1110 may be followed by block 1112.

In block 1112, still referring to FIG. 10, cure the at least one pore of the selected processed silicon wafer causing low current. Block 1112 may be followed by block 1114.

In block 1114, still referring to FIG. 10, after the at least one pore of the selected processed silicon wafer is cured, electrically reconnect the selected processed silicon wafer by turning on the respective switches.

Those of ordinary skill in the art may recognize that modifications of the embodiments disclosed herein are possible. For example, a number of the plurality of solder balls may vary. Other modifications may occur to those of ordinary skill in this art, and all such modifications are deemed to fall within the purview of the present invention, as defined by the claims.

The invention claimed is:

1. A fabrication method of fabricating a porous wafer battery, the fabrication method comprising the steps of:
providing a silicon wafer comprising
a first side;
a second side opposite the first side; and
a plurality of pores, the plurality of pores being through holes extending from the first side of the silicon wafer to the second side of the silicon wafer;
applying a first metallization process so that a first respective metal section of a first plurality of metal sections covers a portion of side walls of each pore of the plurality of pores and a portion of side walls of an adjacent pore of each pore of the plurality of pores;
applying a passivation process forming a plurality of passivation sections;
applying a respective solder ball of a plurality of solder balls at each pore of the plurality of pores;
aligning the silicon wafer with a substrate comprising a plurality of contact bumps; and
applying a solder reflow process so that a respective contact bump of the plurality of contact bumps is attached to each solder ball of the plurality of solder balls.

2. The fabrication method of claim 1, wherein the first plurality of metal sections contains copper.

3. The fabrication method of claim 1 further comprising, after the step of applying the first metallization process and before the step of applying the passivation process, applying a second metallization process so that a second respective metal section of a second plurality of metal sections covers the first respective metal section.

4. The fabrication method of claim 3, wherein the first plurality of metal sections contains titanium; and wherein the second plurality of metal sections contains copper.

5. The fabrication method of claim 1, wherein a majority portion of the respective solder ball is in each pore of the plurality of pores; and wherein a minority portion of the respective solder ball is out of each pore of the plurality of pores.

6. The fabrication method of claim 5, wherein a diameter of each solder ball of the plurality of solder balls is less than fifty microns.

7. The fabrication method of claim 1, wherein each of the plurality of passivation sections is of a letter U shape.

8. The fabrication method of claim 7, wherein a first leg of the letter U shape is directly attached to the first respective metal section of a first selected pore of the plurality of pores; wherein a second leg of the letter U shape is directly attached to the first respective metal section of a second selected pore of the plurality of pores; and wherein the first selected pore is different from the second selected pore.

9. A usage method using a first silicon wafer and a second silicon wafer made by the fabrication method of claim 1,
wherein the first silicon wafer is served as an anode and the second silicon wafer is served as a cathode.

10. A usage method using a first silicon wafer made by the fabrication method of claim 1, the usage method comprising the steps of
forming a respective anode in each pore of the plurality of pores;
forming a respective cathode in each pore of the plurality of pores;
connecting the first silicon wafer to a plurality of sensors;
connecting the first silicon wafer to a plurality of switches; and
connecting the plurality of sensors and the plurality of switches to a battery management system.

11. The usage method of claim 10 further comprising the steps of monitoring a respective temperature of each pore of the plurality of pores; and
electrically disconnecting a selected pore by turning off a respective switch if the respective temperature of the selected pore is larger than a predetermined value.

12. The usage method of claim 10 further comprising the steps of monitoring a respective resistance of each pore of the plurality of pores; and
electrically disconnecting a selected pore by turning off a respective switch if the respective resistance of the selected pore is smaller than a predetermined value.

13. The usage method of claim 10 further comprising the steps of
monitoring respective current of each pore of the plurality of pores;
electrically disconnecting a selected array of pores by turning off respective switches if the respective current of at least one pore of the selected array of pores is smaller than a predetermined value;
curing the at least one pore of the selected array of pores; and
electrically reconnecting the selected array of pores by turning on the respective switches.

14. A usage method using a plurality of silicon wafers made by the fabrication method of claim 1, the usage method comprising the steps of
forming the plurality of silicon wafers as a stacked porous battery;
forming a plurality of anodes and a plurality of cathodes in the plurality of silicon wafers;
connecting the plurality of silicon wafers to a plurality of sensors;
connecting the plurality of silicon wafers to a plurality of switches; and
connecting the plurality of sensors and the plurality of switches to a battery management system.

15. The usage method of claim 14 further comprising the steps of
monitoring respective current of each silicon wafer of the plurality of silicon wafers;
electrically disconnecting a selected silicon wafer by turning off a respective switch if the respective current of the selected silicon wafer is smaller than a predetermined value;
curing the selected silicon wafer; and
electrically reconnecting the selected silicon wafer by turning on the respective switch.

* * * * *